US 9,379,556 B2

(12) United States Patent
Haensgen et al.

(10) Patent No.: US 9,379,556 B2
(45) Date of Patent: Jun. 28, 2016

(54) SYSTEMS AND METHODS FOR ENERGY HARVESTING AND CURRENT AND VOLTAGE MEASUREMENTS

(71) Applicants: Gregg James Haensgen, Menomonee Falls, WI (US); John Fredrick Banting, Waukesha, WI (US); Bruce Hoeppner, Brookfield, WI (US); Richard William Lucas, Cambridge, MN (US)

(72) Inventors: Gregg James Haensgen, Menomonee Falls, WI (US); John Fredrick Banting, Waukesha, WI (US); Bruce Hoeppner, Brookfield, WI (US); Richard William Lucas, Cambridge, MN (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 350 days.

(21) Appl. No.: 13/828,878

(22) Filed: Mar. 14, 2013

(65) Prior Publication Data

US 2014/0266240 A1 Sep. 18, 2014

(51) Int. Cl.
*G01R 31/02* (2006.01)
*H02J 5/00* (2016.01)
*G01R 15/14* (2006.01)

(52) U.S. Cl.
CPC ............... *H02J 5/005* (2013.01); *G01R 15/142* (2013.01)

(58) Field of Classification Search
CPC .............................. H02J 5/005; G01R 15/142
USPC ....................... 324/117 R, 126, 127, 522, 537
See application file for complete search history.

(56) References Cited

U.S. PATENT DOCUMENTS

| 2,273,534 A | 2/1942 | Mitchell |
| 2,953,757 A | 9/1960 | Yarrick et al. |
| 3,025,512 A | 3/1962 | Bloechl |
| 3,253,215 A | 5/1966 | Moakler et al. |
| 3,364,481 A | 1/1968 | Fuzzell |
| 3,386,032 A | 5/1968 | Medlar |
| 3,460,038 A | 8/1969 | Ziegler |
| 3,665,243 A | 5/1972 | Kaneda et al. |
| 3,700,967 A | 10/1972 | Hoss |
| 3,720,872 A | 3/1973 | Russell et al. |
| 3,725,846 A | 4/1973 | Strain |
| 3,735,248 A | 5/1973 | Reese |
| 3,816,816 A | 6/1974 | Schweitzer, Jr. |

(Continued)

FOREIGN PATENT DOCUMENTS

DK WO 2008006521 A1 * 1/2008 ........... G01R 19/252
EP 0589729 A2 3/1994

(Continued)

OTHER PUBLICATIONS

"Examination Report from the Intellectual Property Office" dated Jan. 2, 2012, including Search Report, for related Taiwanese patent appication No. 09614009 (5 pages).

(Continued)

*Primary Examiner* — Patrick Assouad
*Assistant Examiner* — Sean Curtis
(74) *Attorney, Agent, or Firm* — King & Spalding LLP

(57) ABSTRACT

A harvesting and measurement device is operable in at least a normal operation mode, a demand measurement mode, and a fault measurement mode. In the normal operation mode, the device is able to harvest energy from an associated power line and monitor current and voltage conditions through a lower power circuit. In the demand measurement mode, harvesting elements of the circuit are disabled so as not to interfere with accuracy of demand current measurements. In the fault measurement mode, one or more Hall sensors are activated such that high currents can be accurately measured.

22 Claims, 8 Drawing Sheets

(56) References Cited

U.S. PATENT DOCUMENTS

| | | | |
|---|---|---|---|
| 3,995,243 A | 11/1976 | Malmborg | |
| 4,000,462 A | 12/1976 | Boyd et al. | |
| 4,037,155 A | 7/1977 | Ahmed | |
| 4,045,726 A | 8/1977 | Schweitzer, Jr. | |
| 4,157,520 A | 6/1979 | Moates et al. | |
| 4,165,528 A | 8/1979 | Schweitzer, Jr. | |
| 4,288,743 A | 9/1981 | Schweitzer | |
| 4,335,437 A | 6/1982 | Wilson et al. | |
| 4,384,289 A | 5/1983 | Stillwell et al. | |
| 4,456,873 A | 6/1984 | Schweitzer, Jr. | |
| 4,466,042 A | 8/1984 | Zylstra et al. | |
| 4,495,489 A | 1/1985 | Schweitzer, Jr. | |
| 4,510,476 A | 4/1985 | Clatterbuck et al. | |
| 4,558,310 A | 12/1985 | McAllise | |
| 4,593,276 A | 6/1986 | Aida et al. | |
| 4,630,218 A | 12/1986 | Hurley | |
| 4,661,813 A | 4/1987 | Mazzamauro et al. | |
| 4,686,518 A | 8/1987 | Schweitzer, Jr. | |
| 4,694,599 A | 9/1987 | Hart et al. | |
| 4,739,149 A | 4/1988 | Nishiwaki et al. | |
| 4,746,241 A | 5/1988 | Burbank, III | |
| 4,758,962 A | 7/1988 | Fernandes | |
| 4,794,328 A | 12/1988 | Fernandes et al. | |
| 4,794,329 A | 12/1988 | Schweitzer, Jr. | |
| 4,794,332 A | 12/1988 | Schweitzer, Jr. | |
| 4,795,982 A | 1/1989 | Schweitzer, Jr. | |
| 4,799,005 A | 1/1989 | Fernandes | |
| 4,801,937 A | 1/1989 | Fernandes | |
| 4,839,600 A | 6/1989 | Kuurstra | |
| 4,847,780 A * | 7/1989 | Gilker | G01R 15/186 324/127 |
| 4,881,028 A | 11/1989 | Bright | |
| 4,886,980 A | 12/1989 | Fernandes et al. | |
| 4,984,124 A | 1/1991 | Yeh | |
| 5,000,462 A | 3/1991 | Trozzi | |
| 5,006,846 A | 4/1991 | Granville et al. | |
| 5,029,039 A | 7/1991 | Yeh | |
| 5,095,274 A | 3/1992 | Brokaw | |
| 5,155,440 A | 10/1992 | Huang | |
| 5,159,319 A | 10/1992 | Dunk et al. | |
| 5,220,311 A | 6/1993 | Schweitzer, Jr. | |
| 5,241,444 A | 8/1993 | Yeh | |
| 5,258,903 A | 11/1993 | Rodriguez-Cavazos | |
| 5,341,088 A | 8/1994 | Davis | |
| 5,397,982 A | 3/1995 | Van Lankvelt | |
| 5,426,360 A | 6/1995 | Maraio et al. | |
| 5,440,234 A | 8/1995 | Kondo | |
| 5,475,371 A | 12/1995 | Dunk et al. | |
| 5,485,545 A | 1/1996 | Kojima et al. | |
| 5,497,096 A | 3/1996 | Banting | |
| 5,537,327 A | 7/1996 | Snow et al. | |
| 5,548,279 A | 8/1996 | Gaines | |
| 5,559,500 A | 9/1996 | Kase | |
| 5,574,387 A | 11/1996 | Petsche et al. | |
| 5,576,632 A | 11/1996 | Petsche et al. | |
| 5,629,870 A | 5/1997 | Farag et al. | |
| 5,630,954 A | 5/1997 | Toth | |
| 5,650,728 A | 7/1997 | Rhein et al. | |
| 5,661,626 A | 8/1997 | Takeuchi | |
| 5,675,497 A | 10/1997 | Petsche et al. | |
| 5,714,886 A | 2/1998 | Harris | |
| 5,726,847 A | 3/1998 | Dalstein | |
| 5,734,575 A | 3/1998 | Snow et al. | |
| 5,754,383 A | 5/1998 | Huppertz et al. | |
| 5,784,233 A | 7/1998 | Bastard et al. | |
| 5,796,631 A | 8/1998 | Iancu et al. | |
| 5,805,400 A | 9/1998 | Kim | |
| 5,945,820 A | 8/1999 | Namgoong et al. | |
| 5,959,537 A | 9/1999 | Banting et al. | |
| 6,344,748 B1 | 2/2002 | Gannon | |
| 6,470,283 B1 * | 10/2002 | Edel | G01R 19/2513 324/72.5 |
| 6,535,797 B1 | 3/2003 | Bowles et al. | |
| 6,538,797 B1 | 3/2003 | Hunt | |
| 6,587,027 B1 | 7/2003 | Nadd | |
| 6,677,743 B1 | 1/2004 | Coolidge et al. | |
| 6,687,574 B2 | 2/2004 | Pietrowicz et al. | |
| 6,687,575 B2 | 2/2004 | Mattes et al. | |
| 6,798,211 B1 | 9/2004 | Rockwell et al. | |
| 6,815,932 B2 | 11/2004 | Wall | |
| 6,963,226 B2 | 11/2005 | Chiang | |
| 7,010,437 B2 | 3/2006 | Lubkeman et al. | |
| 7,256,701 B2 | 8/2007 | Kono et al. | |
| 7,274,186 B2 | 9/2007 | Yakymyshyn et al. | |
| 7,282,944 B2 | 10/2007 | Gunn et al. | |
| 7,312,603 B2 | 12/2007 | Luo et al. | |
| 7,312,686 B2 | 12/2007 | Bruno | |
| 7,382,272 B2 | 6/2008 | Feight | |
| 7,398,097 B2 | 7/2008 | Parkulo | |
| 7,453,267 B2 | 11/2008 | Westbrock, Jr. et al. | |
| 7,495,574 B2 | 2/2009 | Rocamora et al. | |
| 7,518,529 B2 | 4/2009 | O'Sullivan et al. | |
| 7,557,563 B2 | 7/2009 | Gunn et al. | |
| 7,576,548 B1 | 8/2009 | Lo et al. | |
| 7,609,158 B2 | 10/2009 | Banting et al. | |
| 7,656,763 B1 | 2/2010 | Jin et al. | |
| 7,691,538 B2 | 4/2010 | Takahashi | |
| 7,714,735 B2 | 5/2010 | Rockwell | |
| 7,733,094 B2 | 6/2010 | Bright et al. | |
| 7,733,224 B2 | 6/2010 | Tran | |
| 7,746,241 B2 | 6/2010 | Feight et al. | |
| 7,777,605 B2 | 8/2010 | Zumoto et al. | |
| 7,864,012 B2 | 1/2011 | Merck et al. | |
| 7,868,776 B2 | 1/2011 | Kesler et al. | |
| 7,930,141 B2 | 4/2011 | Banting | |
| 8,045,309 B2 * | 10/2011 | Shimada | H02M 5/293 361/91.1 |
| 8,342,494 B2 | 1/2013 | Ricci et al. | |
| 8,395,372 B2 | 3/2013 | Harlev et al. | |
| 8,441,817 B2 | 5/2013 | Paajarvi | |
| 8,536,857 B2 | 9/2013 | Nero, Jr. | |
| 8,686,738 B2 * | 4/2014 | Sexton | H02H 3/10 324/539 |
| 8,843,334 B2 * | 9/2014 | Donaldson | G01R 21/1331 324/76.11 |
| 2004/0037018 A1 | 2/2004 | Kim | |
| 2004/0183522 A1 | 9/2004 | Gunn et al. | |
| 2005/0017751 A1 | 1/2005 | Gunn et al. | |
| 2005/0146220 A1 | 7/2005 | Hamel et al. | |
| 2005/0151659 A1 | 7/2005 | Donovan et al. | |
| 2006/0063522 A1 | 3/2006 | McFarland | |
| 2006/0187074 A1 | 8/2006 | O'Sullivan et al. | |
| 2006/0279910 A1 | 12/2006 | Gunn et al. | |
| 2007/0059986 A1 | 3/2007 | Rockwell | |
| 2007/0086135 A1 | 4/2007 | Swartzendruber et al. | |
| 2007/0136010 A1 | 6/2007 | Gunn et al. | |
| 2007/0270114 A1 | 11/2007 | Kesler et al. | |
| 2007/0285201 A1 | 12/2007 | Zumoto et al. | |
| 2008/0001735 A1 | 1/2008 | Tran | |
| 2008/0012702 A1 | 1/2008 | Feight et al. | |
| 2008/0077336 A1 | 3/2008 | Fernandes | |
| 2008/0284585 A1 | 11/2008 | Schweitzer, III et al. | |
| 2009/0015239 A1 | 1/2009 | Georgiou et al. | |
| 2009/0079417 A1 * | 3/2009 | Mort | G01R 15/14 324/111 |
| 2009/0115426 A1 * | 5/2009 | Muench, Jr. | G01R 19/2513 324/537 |
| 2009/0119068 A1 * | 5/2009 | Banting | G01R 19/2513 702/188 |
| 2009/0231764 A1 | 9/2009 | Banting et al. | |
| 2010/0013457 A1 | 1/2010 | Nero, Jr. | |
| 2010/0084920 A1 * | 4/2010 | Banting | G01R 15/142 307/66 |
| 2010/0085036 A1 * | 4/2010 | Banting | G01R 15/14 324/127 |
| 2010/0264906 A1 * | 10/2010 | Shamir | G01R 15/186 324/127 |
| 2010/0280775 A1 * | 11/2010 | Schafer | H02J 13/0075 702/62 |
| 2010/0318306 A1 * | 12/2010 | Tierney | G01D 4/002 702/62 |
| 2011/0291488 A1 * | 12/2011 | Paik | G01D 21/00 307/104 |

(56) References Cited

U.S. PATENT DOCUMENTS

| | | | | |
|---|---|---|---|---|
| 2014/0088776 | A1* | 3/2014 | Brandt | H02J 3/32 700/295 |
| 2014/0145858 | A1* | 5/2014 | Miller | G08C 17/02 340/870.07 |
| 2014/0200843 | A1* | 7/2014 | Shamir | G01R 21/133 702/107 |
| 2014/0266240 | A1* | 9/2014 | Haensgen | H02J 5/005 324/537 |
| 2014/0268701 | A1* | 9/2014 | Haensgen | H05B 33/0815 362/183 |

FOREIGN PATENT DOCUMENTS

| | | | | |
|---|---|---|---|---|
| FR | 2717582 | A1 | 9/1995 | |
| GB | WO 2008142431 | A1 * | 11/2008 | G01D 4/002 |
| WO | 9943010 | A2 | 8/1999 | |
| WO | 20070143378 | A2 | 12/2007 | |
| WO | 2008006521 | A1 | 1/2008 | |
| WO | 2008142431 | A1 | 11/2008 | |

OTHER PUBLICATIONS

"Research for Structure of Wireless Sensor Networks based on power transmission hallway", Peng Zheng et al., Engineering Journal of Wuhan University, vol. 39, No. 3, Jun. 30, 2006, pp. 12-16, cited in office action dated Nov. 9, 2011 for related Chinese patent application No. 200780048163.5 (6 pages).

The institute of Electrical and Electronics Engineers, Inc., IEEE Spectrum, New Ways to Play, Electronic Music Interfaces, Dec. 1997, 3 pages.

Cooper Power Systems; Fault Indicators, S.T.A.R.™ Faulted Circuit Indicators Electrostatic Reset Type, Electrical Apparatus 320-60, May 1997, 4 pages.

Cooper Power Systems; Fault Indicators, S.T.A.R.™ Faulted Circuit Indicators Low Voltage Reset Type, Electrical Apparatus 320-50, May 1997, 4 pages.

Cooper Power Systems; Fault Indicators, S.T.A.R.™ Faulted Circuit Indicators Test Point Reset Type, Electrical Apparatus 320-40, May 1997, 4 pages.

Cooper Power Systems; Fault Indicators, S.T.A.R.™ Type ER Faulted Circuit Indicator Installation Instructions, Service Information S320-60-1, Dec. 1997, 2 pages.

Cooper Power Systems; Fault Indicators, S.T.A.R.™ Type LV Faulted Circuit Indicator Installation Instructions, Service Information S320-50-1, May 1997, 4 pages.

Cooper Power Systems; Fault Indicators, S.T.A.R.™ Type TPR Faulted Circuit Indicator Installation Instrutions, Service Information S320-40-1, Dec. 1997, 3 pages.

Cooper Power Systems; S.T.A.R.™ Faulted Circuit Indicators, Low Voltage Reset Type, Bulletin No. 97035, Jan. 1998, 2 pages.

Cooper Power Systems; S.T.A.R.™ Faulted Circuit Indicators, Test Point Reset Type, Bulletin No. 97034, Jan. 1998, 2 pages.

International Search Report and Written Opinion From Corresponding PCT Application No. PCT/US2014/025589, Mailed Sep. 4, 2014, 7 Pages.

* cited by examiner

SYSTEMS AND METHODS FOR ENERGY HARVESTING AND CURRENT AND VOLTAGE MEASUREMENTS

RELATED APPLICATIONS

The present application is related to U.S. Provisional Application No. 61/372,360, filed Aug. 10, 2010, entitled "Mounting Methods for Overhead Device;" U.S. patent application Ser. No. 11/982,588, entitled "Communicating Faulted Circuit Indicator Apparatus and Method of Use Thereof," filed Nov. 2, 2007; U.S. patent application Ser. No. 12/569,343, entitled "Overhead Communicating Device," filed on Sep. 29, 2009; and U.S. patent application Ser. No. 12/569,446, entitled "Power Line Energy Harvesting Power Supply," filed on Sep. 29, 2009. The complete disclosure of each of the foregoing applications is hereby fully incorporated herein by reference.

TECHNICAL FIELD

The present disclosure relates generally to harvesting energy as well as making current measurements with a device having a single current transformer and to systems, methods, and devices for improved energy harvesting, and making current and voltage measurements with the device.

BACKGROUND

Typical current transformer devices for energy harvesting and current measurements utilize one current transformer dedicated to energy harvesting and another current transformer for measuring current. Recent technology has provided current transformer devices that can use the same current transformer to both harvest energy from a conductor as well as to measure current on the conductor. For example, such devices can be used on power lines and other power distribution equipment. Such current transformers include a harvesting circuit portion and a measurement circuit portion. The harvesting circuit portion generally includes non-linear elements. However, these non-linear elements can negatively affect the accuracy of the current measurements as shown in FIG. 3C. Additionally, such harvesting and measurement current transformer devices use the same iron or steel core current transformer for both energy harvesting and current measuring. These types of current transformers tend to saturate at high currents, such as 1200 amps, making it difficult or impossible to accurately measure high current situations such as in the case of a fault current on the conductor. Certain devices use Rogowski coils for making accurate current measurements. However, such current transformers generally cannot be used to harvest energy.

SUMMARY

In an example embodiment of the present disclosure, a harvesting and measurement device includes a current transformer and a device circuit coupled to the current transformer. The device circuit includes an energy harvesting circuit having non-linear elements and a switching device coupled to the energy harvesting circuit capable of conductively coupling and decoupling the energy harvesting circuit from the device circuit. The device circuit also includes a microcontroller coupled to the switching device, wherein the microcontroller controls the switching device to couple and decouple the energy harvesting circuit from the device circuit, and controls at least one Hall sensor coupled to the microcontroller. The device circuit is operable in at least a normal operation mode, a demand measurement mode, and a fault measurement mode. In the normal operation mode, the energy harvesting circuit is conductively coupled to the device circuit and the current transformer. In the demand measurement mode, the energy harvesting circuit is conductively decoupled from the device circuit, and the current transformer is configured to make accurate current readings. In the fault measurement mode, the Hall sensor is energized and configured to make current readings.

In another example embodiment of the present disclosure, a method of making a demand current measurement includes bypassing one or more energy harvesting elements in a device circuit, taking a series of current measurement readings with a current transformer, wherein the current transformer is coupled to the device circuit, restoring the one or more energy harvesting elements in the device circuit, and calculating a current measurement from the series of current measurement readings.

In another example embodiment of the present disclosure, a method of making a fault measurement is described that includes the steps of: enabling at least one Hall sensor in a device circuit, making a first current measurement with the at least one Hall sensor, making a second current measurement with the current transformer, making a current direction measurement, determining if a number of AC cycles is completed, making another first current measurement, another second current measurement, and another current direction measurement if the number of AC cycles is not completed, and reporting a fault current measurement if the cycle is completed.

BRIEF DESCRIPTION OF THE DRAWINGS

For a more complete understanding of the disclosure and the advantages thereof, reference is now made to the following description, in conjunction with the accompanying figures briefly described as follows.

Figure 1:
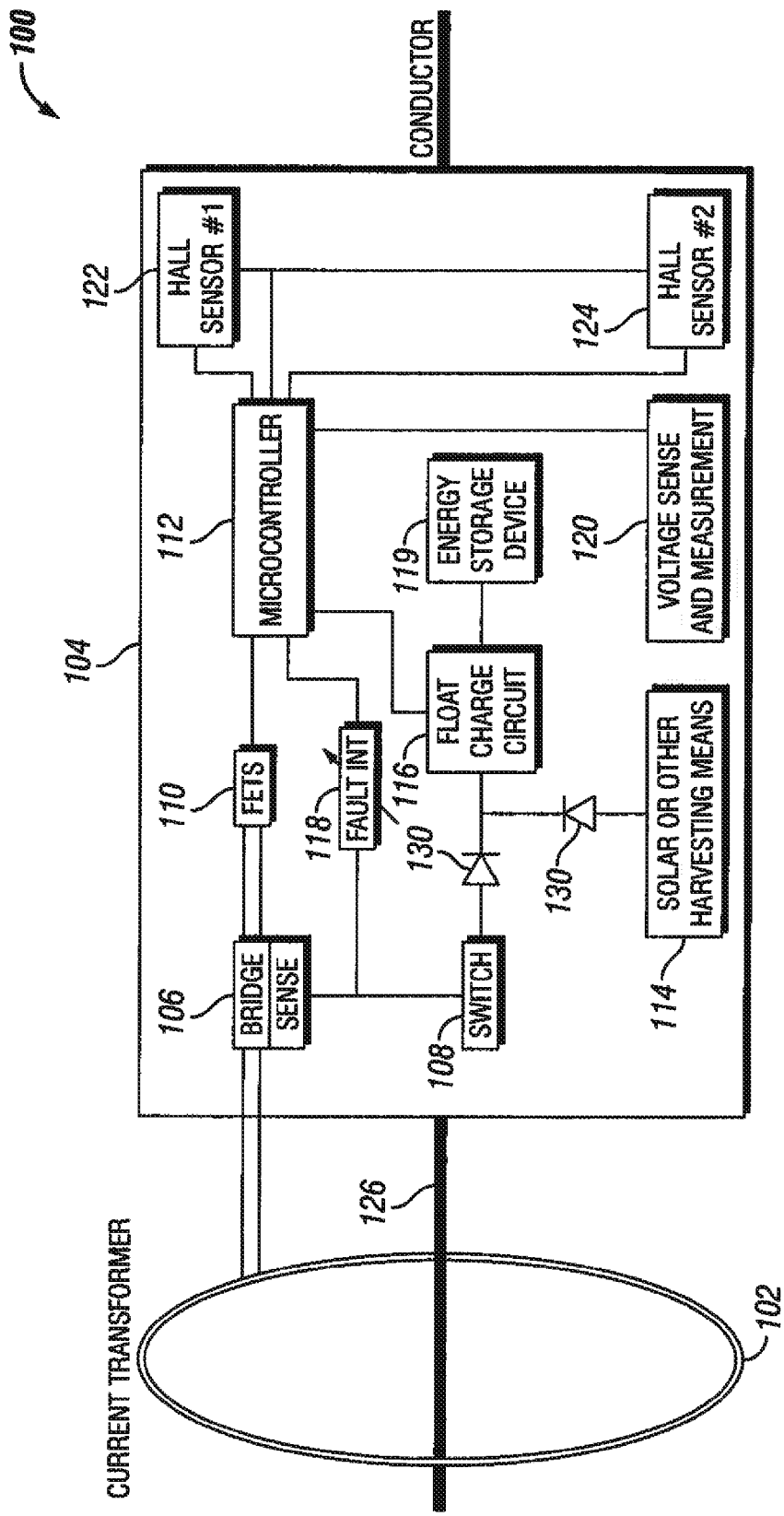
FIG. 1 illustrates a harvesting and measuring current transformer device in accordance with an example embodiment of the present disclosure.

The drawings illustrate only example embodiments of the disclosure and are therefore not to be considered limiting of its scope, as the disclosure may admit to other equally effective embodiments. The elements and features shown in the drawings are not necessarily to scale, emphasis instead being placed upon clearly illustrating the principles of example embodiments of the present disclosure. Additionally, certain dimensions may be exaggerated to help visually convey such principles.

DETAILED DESCRIPTION OF EXAMPLE EMBODIMENTS

In the following paragraphs, the present disclosure will be described in further detail by way of example with reference to the attached drawings. In the description, well known components, methods, and/or processing techniques are omitted or briefly described so as not to obscure the disclosure. As used herein, the "present disclosure" refers to any one of the embodiments of the disclosure described herein and any equivalents. Furthermore, reference to various feature(s) of the "present disclosure" is not to suggest that all embodiments must include the referenced feature(s).

Among embodiments, some aspects of the present disclosure are implemented by a computer program executed by one or more processors, as described and illustrated. As would be apparent to one having ordinary skill in the art, the present disclosure may be implemented, at least in part, by computer-readable instructions in various forms, and the present disclosure is not intended to be limiting to a particular set or sequence of instructions executed by the processor.

Figure 4:
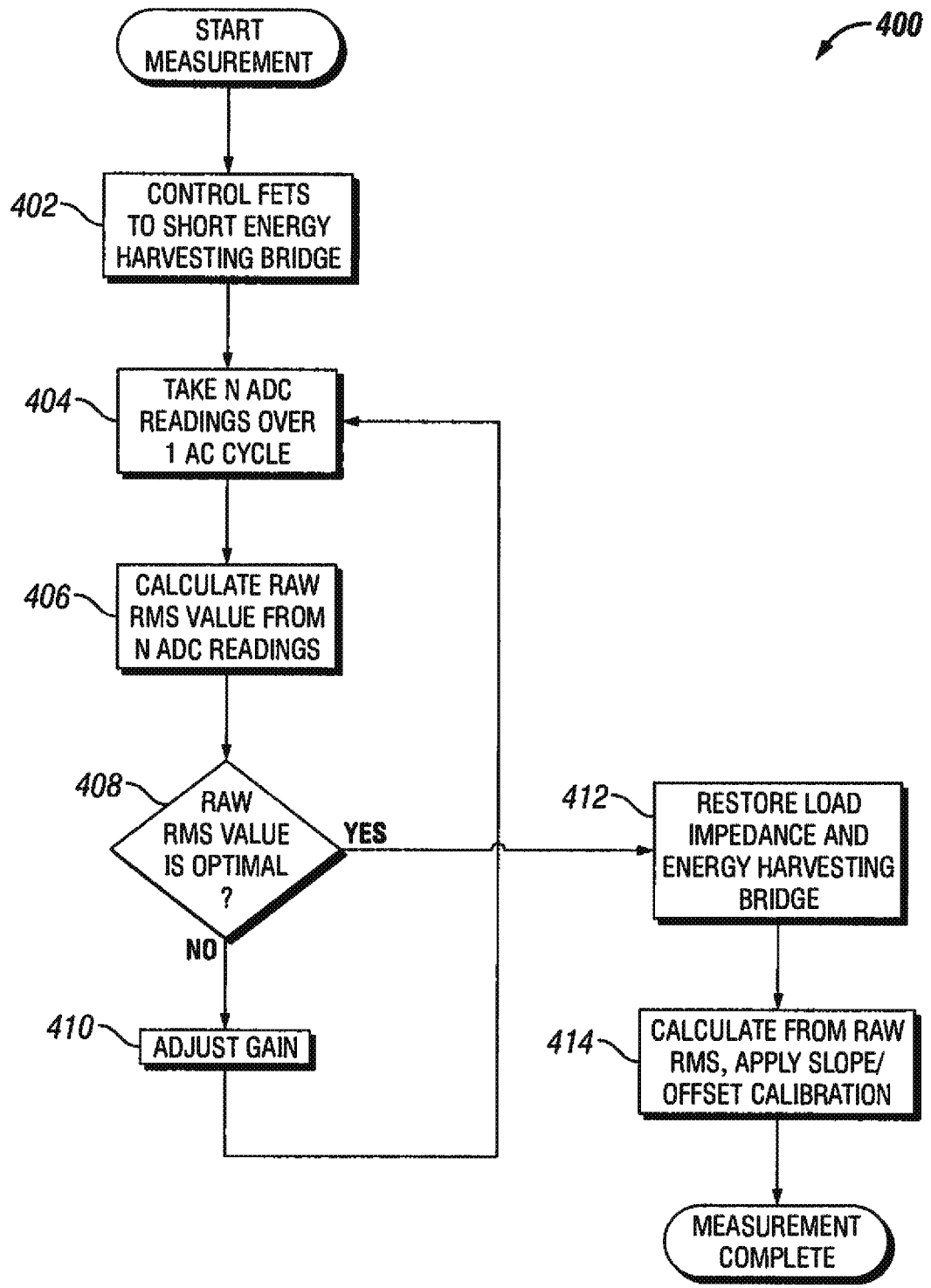
FIG. 4 illustrates a process flowchart of a method of taking a current or voltage measurement under normal current conditions, in accordance with an example embodiment of the present disclosure.
Figure 5:
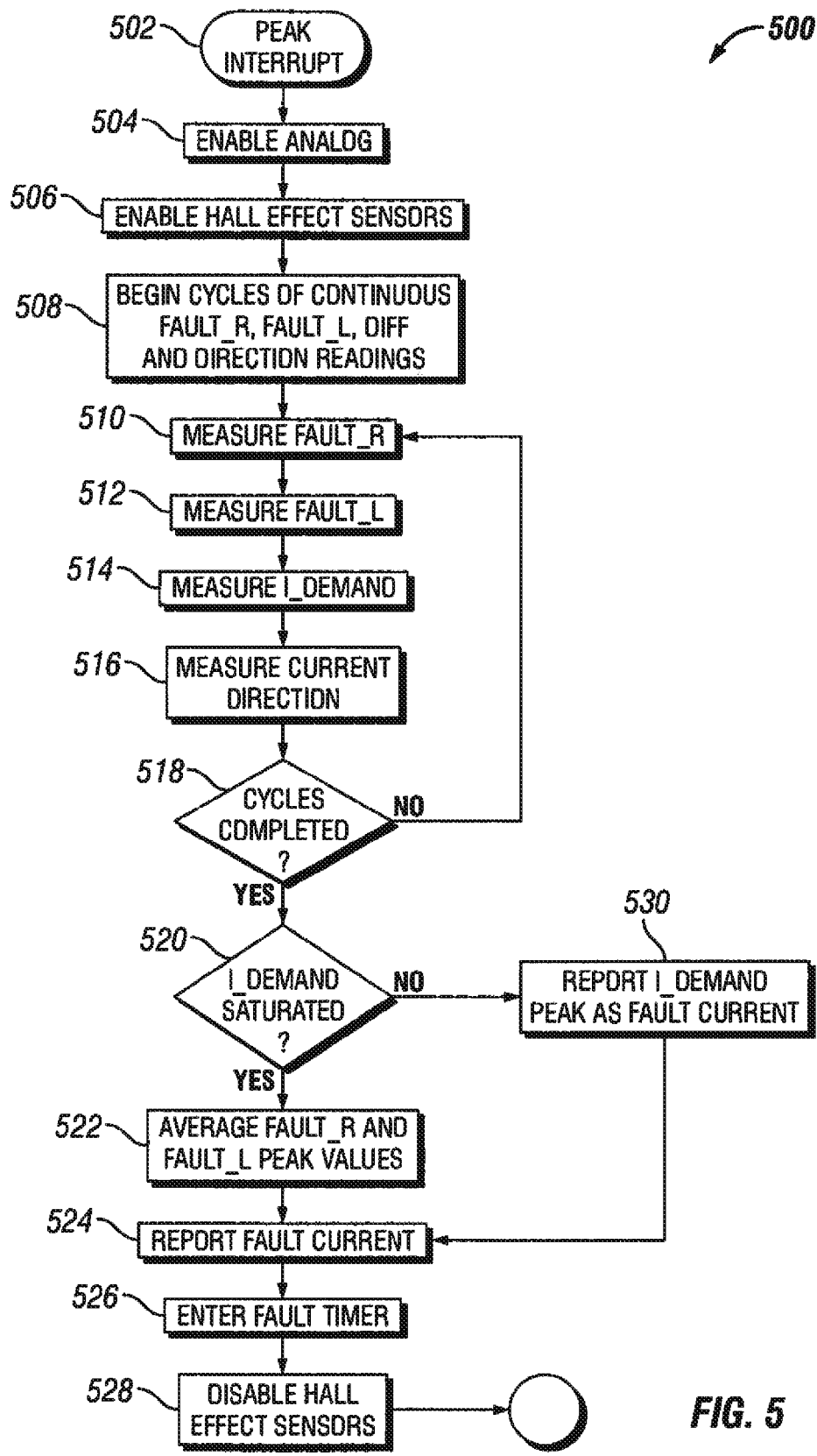
FIG. 5 illustrates a process flowchart of a method of taking a fault current measurement under high current conditions utilizing Hall effect sensors or lower current conditions with a current transformer, in accordance with an example embodiment of the present disclosure.

With regard to the process flow diagrams of FIGS. 4 and 5, it is noted that the present disclosure may be practiced using an alternative order of the steps illustrated in FIGS. 4 and 5. That is, the process flows illustrated in FIGS. 4 and 5 are provided as examples only, and the present disclosure may be practiced using process flows that differ from those illustrated. Additionally, it is noted that not all steps are required in every embodiment. In other words, one or more of the steps may be omitted or replaced, without departing from the spirit and scope of the disclosure. In alternative embodiments, steps may be performed in different orders, in parallel with one another, or omitted entirely, and/or certain additional steps may be performed without departing from the scope and spirit of the disclosure.

The present disclosure provides a current transformer device capable of harvesting power from a conductor as well as making current measurements on the conductor and detecting high current fault events. The current transformer device is able to provide increased measurement accuracy by bypassing the non-linear elements of the energy harvesting function when making current measurements. Additionally, the current measurement function is further enhanced by the addition of two Hall effect sensors which are capable of measuring high fault currents and providing data associated with high current fault events. Certain embodiments of the current transformer device also provide voltage sensing means which allow the current transformer device to monitor for voltage conditions as well, such as sag and swell and other events. The means of detecting and measuring voltage also lends to determining load and fault current direction with the same current transformer and voltage plates. The device and certain example embodiments of the disclosure are described in further detail below along with the drawings, in which like numerals indicate like elements throughout.

Turning to the drawings, FIG. 1 illustrates a harvesting and measurement device 100. The harvesting and measurement device 100 includes a current transformer 102 and a circuit 104 coupled to and generally disposed with the current transformer 102. When the harvesting and measurement device 100 is in use, the current transformer 102 is disposed and enclosed around a conductor 126 to be monitored. In an example embodiment, the circuit 104 further includes an energy harvesting bridge 106, a switch 108, one or more field effect transistors (FETs) or other types of analog switches 110, a microcontroller 112, a float charge circuit 116, an energy storage device 119, one or more alternate harvesting means 114, a voltage measurement means 120, a first Hall effect sensor 122, and a second Hall effect sensor 124. It should be noted that the first and second Hall sensors 122, 124 are used herein as examples of high current sensors. In certain other example embodiments, other types of high current sensors are used in addition to or in place of the Hall sensors 122, 124. Such high current sensors include, but are not limited to, inductors, reed switches, and MEMS devices.

In certain example embodiments, the circuit is operable at least in a normal operation mode, a demand measurement mode, and a fault event measurement mode (also known as a high current measurement mode). In the normal operation mode, the circuit 104 is able to harvest energy from the conductor 126 via the energy harvesting bridge 106 and the current transformer 102. In the normal operation mode, the circuit is also continuously monitoring the current and/or the voltage in the conductor. The monitoring of the current and/or voltage is done through a low power monitoring circuit implemented within the circuit. In certain example embodiments, the low power monitoring circuit compares the current and/or voltage of the conductor to a preset current and/or voltage criteria, which represents an expected condition of the current and/or voltage in the conductor 126 for normal, stable operation. In certain example embodiments, the low power monitoring circuit further includes a low power current monitoring circuit and a low power voltage monitoring circuit. Specific embodiments and implementations of current monitoring and voltage monitoring are described in further detail below along with example embodiments of the preset current and voltage criteria. Detecting a current and/or voltage which falls outside of the respective criteria may be an indication of a fault event in the conductor 126. When it is detected that a fault event may have occurred according to the monitored current and/or voltage, the circuit 104 may be put into the fault event measurement mode.

The energy harvesting bridge 106 generally contains one or more non-linear elements, which may affect the accuracy of current measurements made on the current transformer 102. In the normal operation mode, the energy harvesting bridge 106 remains conductively coupled to the circuit 104 because, in certain example embodiments, the low power monitoring circuit is configured to detect a relatively large shift or out of bound activity in the current and/or voltage signal rather than taking exact value measurements. Thus, high accuracy is not required. However, in the demand measurement mode, the energy harvesting bridge 106 is bypassed from the circuit 104 because accurate current and/or voltage measurements are to be made in the demand measurement mode. In the demand measurement mode, the energy harvesting bridge 106 and its non-linear elements are bypassed or shorted out so as not to interfere with the accuracy of the current measurement.

In certain example embodiments, the energy harvesting bridge 106 is shorted out or bypassed by the FETs or other types of analog switches 110 while in the demand measurement mode. Specifically, during the demand measurement period, the microcontroller 112 controls the FET switches 110 to bypass the energy harvesting bridge 106 while using the current transformer 102 to take a series of current readings. In such embodiments, the device 100 is able to provide linear current readings from hundreds of milliamps to hundreds of amps. Upon completion of the current measurement, the FETs 110 are controlled to restore the energy harvesting bridge 106 to its original state in the circuit 104 for optimal energy harvesting. In certain example embodiments, the device 100 is put into the demand measurement mode based on a command from an operator. In certain example embodiments, the device 100 is put into the measurement mode according to a predetermined and/or preprogrammed schedule or time interval. The process of making current measurements will be discussed in further detail below and with respect to the process flowchart of FIG. 3.

In certain example embodiments, the current transformer 102 saturates at high current level (i.e., saturation current), such as 1200 amps, and thus is not able to produce accurate current measurements when the current in the conductor 126 is greater than the saturation level. As such, high current fault events may not be properly measured by the current transformer 102 alone, in the present disclosure, when the device 100 detects that a potential fault condition has occurred, the device 100 goes into the fault event measurement mode. In the fault event measurement mode, the device 100 wakes up the Hall effect sensors 122, 124 to take current readings on the conductor 126 as Hall effect sensors 122, 124 are able to provide accurate readings at high currents. However, the current transformer 102 is more accurate in measuring lower current levels than the Hall effect sensors 122, 124. Thus, in certain example embodiments, when a potential fault condition is detected, both the current transformer 102 and the Hall effect sensors 122, 124 make current measurements. The microcontroller then determines whether the measured fault current is above or below the saturation current of the current transformer 102. If the measured fault current is at or above the saturation current, then the current readings from the Hall effect sensors 122, 124 are reported. If the measured fault current is below the saturation current, then the current reading from the current transformer 102 is reported. This is especially important when the device 100 is installed in delta systems in which fault currents are typically between 10 amps to 100 amps, and are thus more effectively measured with the current transformer 102 than then Hall effect sensors 122, 124.

In certain example embodiments, the device may go from the normal operation mode to the fault event measurement mode. As discussed above, when the low power monitoring circuit detects certain current/voltage activity, or a qualifying event, that may be indicative of a fault event, the device is put into the fault event measurement mode. For example, when the current transformer 102 detects a certain current spike, seen as a certain rise in current value with respect to time, a qualifying current event is said have occurred. As another example, when the voltage sensing means 120 detects a certain drop in voltage with respect to time, a qualifying voltage event is said to have occurred. In certain example embodiments, the occurrence and/or detection of either a qualifying current event or a qualifying voltage event triggers the microcontroller 112 to put the device in the fault event measurement mode and wakes up high power portions of the circuit, such as the Hall effect sensors, portions of the voltage sensing circuit 120, and certain amplification and conditioning circuit elements, to prepare to make accurate current and/or voltage measurements. In certain example embodiments, the microcontroller 112 must see both a qualifying current event and/or a qualifying voltage event to put the device into the fault event measurement mode. The process of making current measurements in response to a fault event will be discussed in further detail below and with respect to the process flowchart of FIG. 4.

The Hall effect sensors 122, 124 and other high power components in the circuit 104 typically use a relatively large amount of power, so such components remain unpowered during the normal operation mode when these components are not needed and only powered when accurate measurements are needed, such as in response to a detected fault event. Thus, the device 100 is able to conserve power when possible and be energy efficient. In certain example embodiments, the two Hall effect sensors 122, 124 are disposed on opposite sides of the device 100 at equal distances and on opposing sides of the conductor 126 when the device 100 is attached to the conductor 126. Such a configuration aids in accommodating for possible alignment errors of the device 100 when attached to the conductor 126. In certain example embodiments, the Hall effect sensors 122, 124 do not necessarily have to be placed perfectly on either side of the conductor 126, as having two Hall effect sensors 122, 124 accommodates for alignment issues that may otherwise arise. Generally, if the sensor is perfectly placed or centered on the conductor 126, the Hall effect sensors 122, 124 produce equivalent amplitudes. However, if the device 100 is misaligned on the conductor 126, but the device includes two Hall effect sensors 122, 124 placed in the above configuration, the sum of the amplitudes from the two Hall effect sensors 122, 124 is the same as that of the perfectly aligned condition. Thus, the device 100 can be effectively used anywhere with minimized decrease in accuracy. Additionally, in certain example embodiments, the Hall effect sensors 122, 124 are also able to detect current on adjacent conductors, which provides additional information at each location that can be used to determine system performance. In certain example embodiments, the AC signals from the Hall effect sensors 122, 124 can also be used to compare and calibrate phase shift associated with the current transformer 102.

In certain example embodiments, the voltage measurement circuit 120 provides a means for voltage monitoring and measuring. In certain example embodiments, the voltage measurement circuit 120 includes a low power voltage monitoring circuit of the low power measurement circuit. For example, such portion of the voltage measurement circuit 120 continuously monitors voltage in the conductor 126 to detect for sag and swell in accordance with a configurable voltage window. In certain example embodiments, the voltage window defines a voltage range in which the conductor is expected to stay within during normal stable operation. In an example embodiment, the device 100, when installed on the conductor 126, can self-detect the voltage on the conductor 126 and adjust the voltage window around the detected line voltage with a configuration tolerance range. If the line voltage falls outside the voltage window, the device 100 alerts that there is an out of tolerance voltage event. In certain example embodiments, the voltage window also allows for monitoring of voltage changes with respect to time that occur on the line in delta systems. For example, when a single phase fault occurs on one phase, the other phases see a high voltage change (i.e., spike) that can be used in conjunction with the measured current spike on the faulted phase to validate the fault event.

Figure 3A:
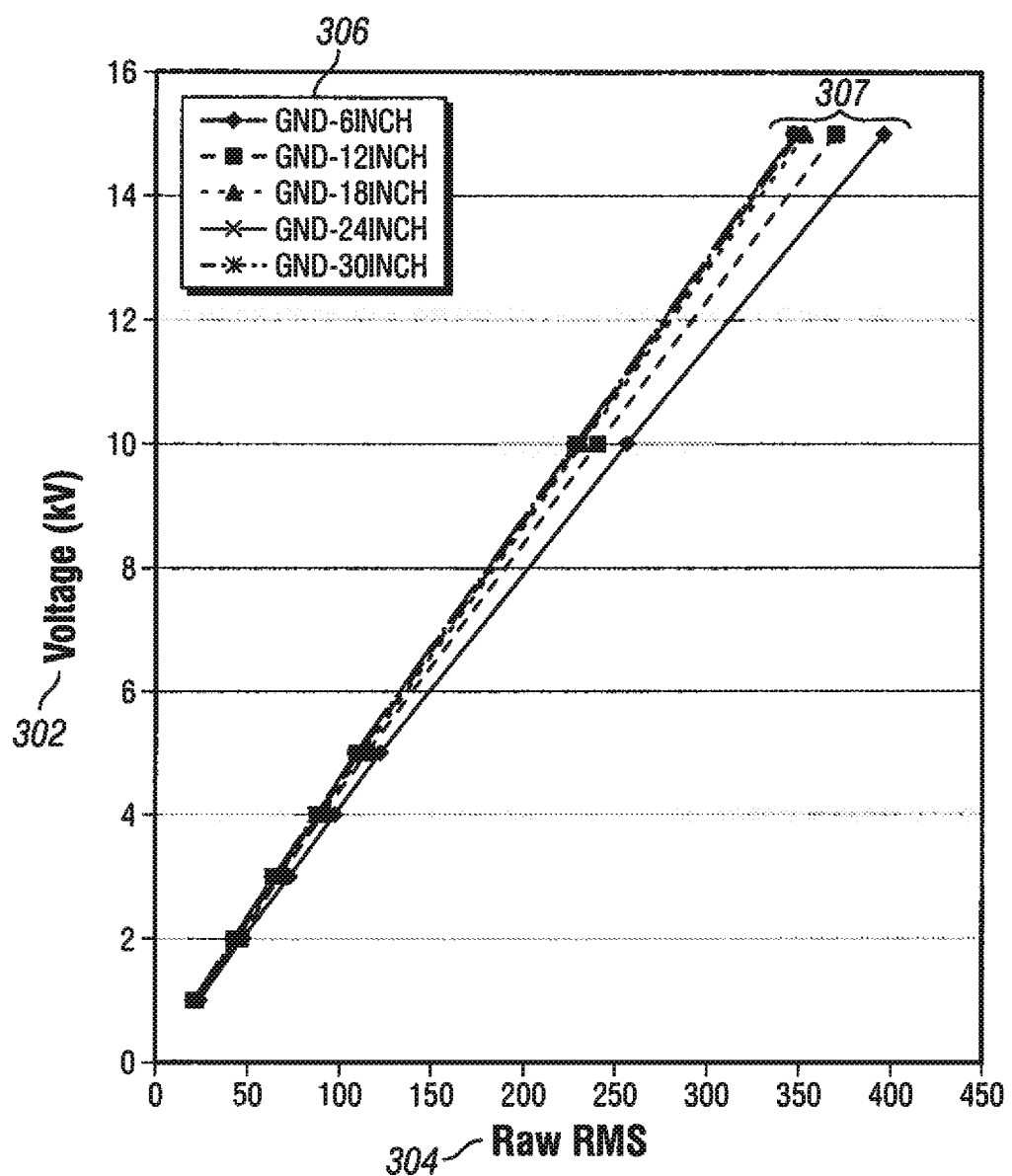
FIG. 3A illustrates a graph of voltage measurement relationship between conductors having different distances from ground, in accordance with an example embodiment of the present disclosure.
Figure 3B:
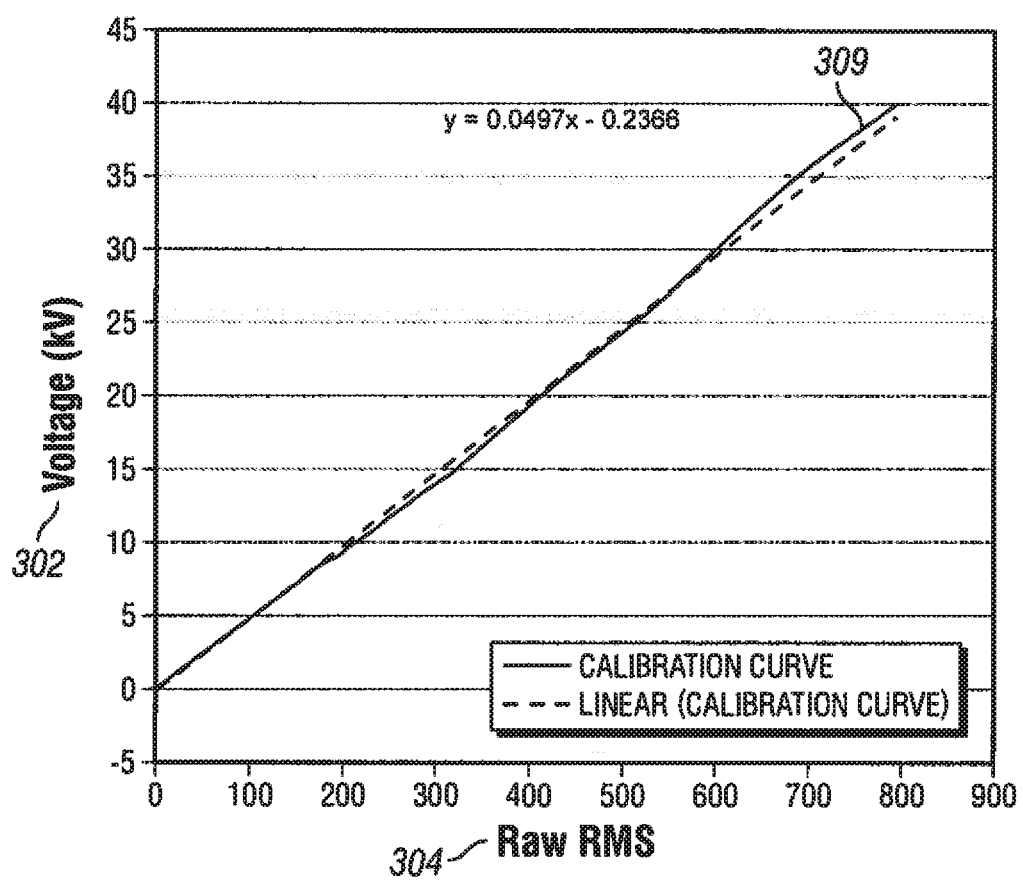
FIG. 3B illustrates a graph of a voltage calibration curve in accordance with an example embodiment of the present disclosure.
Figure 3C:
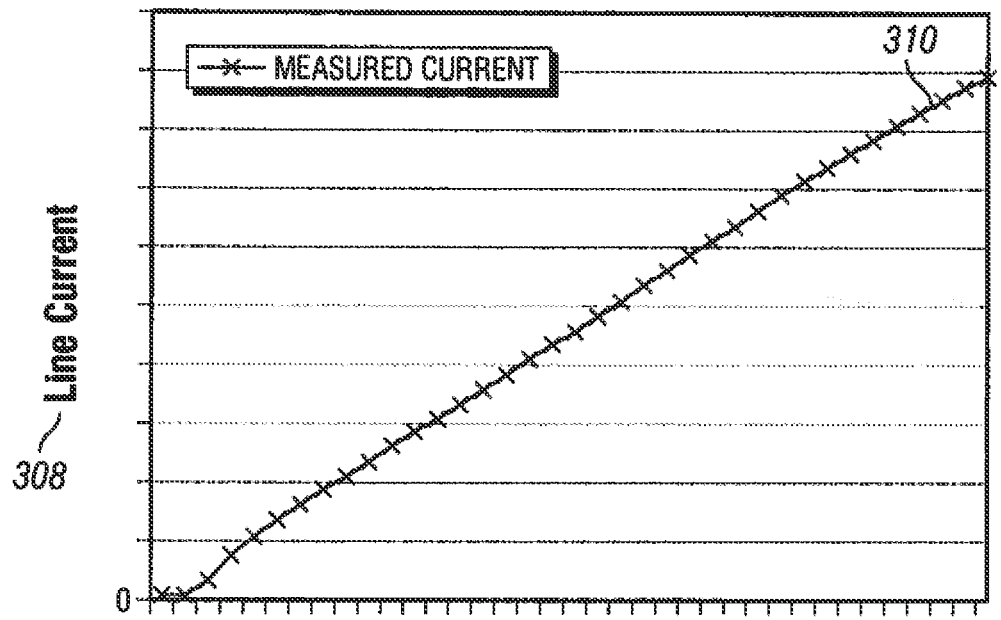
FIG. 3C illustrates a graph of a current measurement relationship with energy harvesting enabled in accordance with an example embodiment of the present disclosure.
Figure 3D:
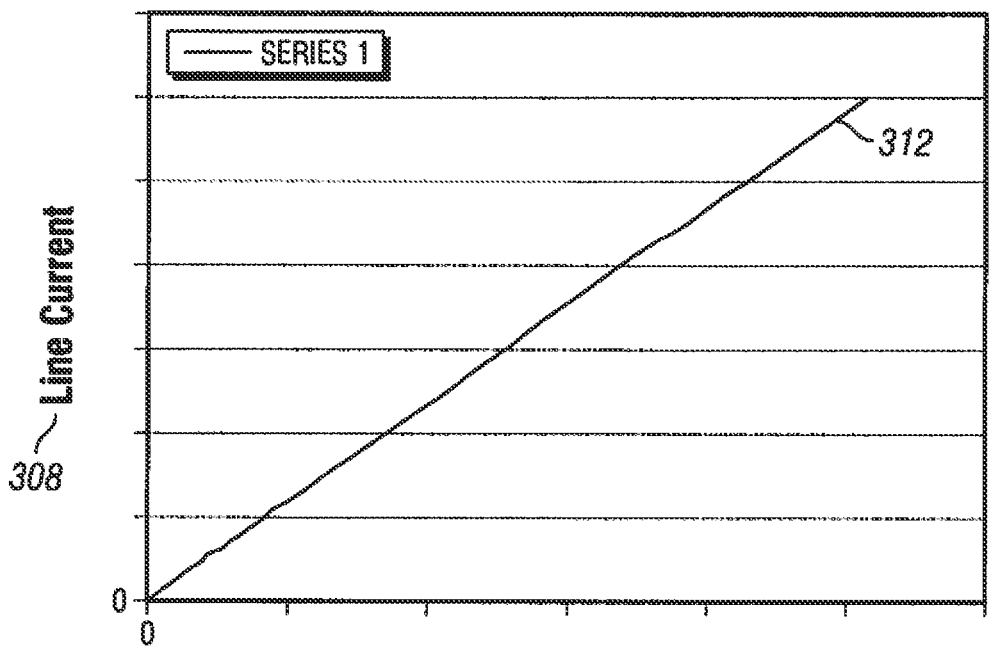
FIG. 3D illustrates a graph of a current measurement relationship with energy harvesting disabled in accordance with an example embodiment of the present disclosure.

In certain example embodiments, the voltage measurement circuit 120 includes one or more pairs of parallel plates which are tied to gain stages which then feed into the voltage window, providing a controlled and accurate means of detecting the line voltage. Specifically, one of the plates (i.e, the ground plate 193) is tied to the circuit ground and the other plate is the sensing plate 191 and is tied to the voltage reading path. In certain example embodiments, the circuit ground and the ground plate are brought to the conductor line potential. The electrical field strength is substantially uniform between the conductor 126 and the neutral or system ground, and because the parallel plates are related to the thickness of a circuit board on which the circuit 104 is implemented, the electrical field strength across the board is substantially consistent and not influenced greatly by the distance between the conductor and ground. Additionally, corona that may otherwise occur on the board is minimized due to the entire device 100 being at line potential. FIG. 3A illustrates a graph showing the effects of conductor 126 to ground distance on voltage measurements. As shown, the relationship 307 between the actual voltage 302 on the conductor 126 and the raw RMS value 304, which is indicative of a measured voltage, is linear at all distances 306 and substantially similar, especially at larger distances from the conductor to ground. FIG. 3B illustrates a calibration curve 309 in accordance with an example embodiment of the present disclosure. As shown, because of the linearity of the data in FIG. 3A, the relationship between the line voltage 302 and the measured raw RMS 304 can be easily calibrated for the distance 306 between the line and ground. FIG. 3C illustrates a graph showing the relationship 310 between actual line current 308 and measured RMS 304 from the current transformer current readings when the energy harvesting bridge 106 is not bypassed. As shown, the relationship 310 is generally not linear, especially at lower line currents and thus provides less accurate current readings. FIG. 3D illustrates a graph showing the relationship 312 between actual line current 308 and measured RMS 304 from the current transformer current readings when the energy harvesting bridge 106 is bypassed. As shown, the relationship 312 is linear and thus provides accurate current readings.

Being able to make both voltage and current measurements also allows for detecting current flow direction and power factor. Specifically, the phase relationship between the voltage and the current during a normal load condition or fault condition is indicative of the load or fault current direction. Thus, a fault magnitude and direction may be measured and analyzed by the Hall effect sensors 122, 124 or directly from the current transformer 102.

In certain example embodiments, the harvesting and measurement device 100 allows for additional energy harvesting from alternative sources via the alternate harvesting means 114. Specifically, through the alternative harvesting means 114, the harvesting and measurement device 100 is able to obtain energy from solar, vibration, thermal, RF noise, wind, electrostatic field, and other energy sources in addition to energy harvested from the conductor 126 by the current transformer 102. For example, in an example embodiment, the alternate harvesting means 114 includes a solar panel integrated into the device 100, which allows the device 100 to harvest and store solar energy without affecting the current monitoring or measuring circuiting. Thus, in certain example embodiments, the alternate harvesting means 114 may continue to harvest while accurate current and/or voltage measurements are made. In certain example embodiments, a rechargeable power source such as a battery or supercapacitor is charged by the alternate harvesting means 114. In certain example embodiments, a primary power source such as a battery is used in place of harvesting elements to serve the purpose of the alternate harvesting means 114. Integrating such alternate harvesting means 114 and/or primary or rechargeable power sources into the device 100 aids in maintaining a completely pollable device on very low loaded lines or when the current transformer harvesting elements are being bypassed as discussed above.

In certain example embodiments, energy harvested from the current transformer 102 and the energy harvested from the alternate harvesting means 114 is stored in the energy storage device 119. The float charge circuit 116 and the diodes 130 which are coupled between the current transformer 102 and bridge 106, and the alternate harvesting means 114 help to prevent harvested and stored energy from feeding back into the respective harvesting and/or charging mechanisms. In certain example embodiments, the switch 108 provides a means of discontinuing harvesting from the current transformer 102 or during times when the device 100 is harvesting from the alternative harvesting means 114 or when there is an error in the float charge circuit 116 or energy storage device 119.

Figure 2:
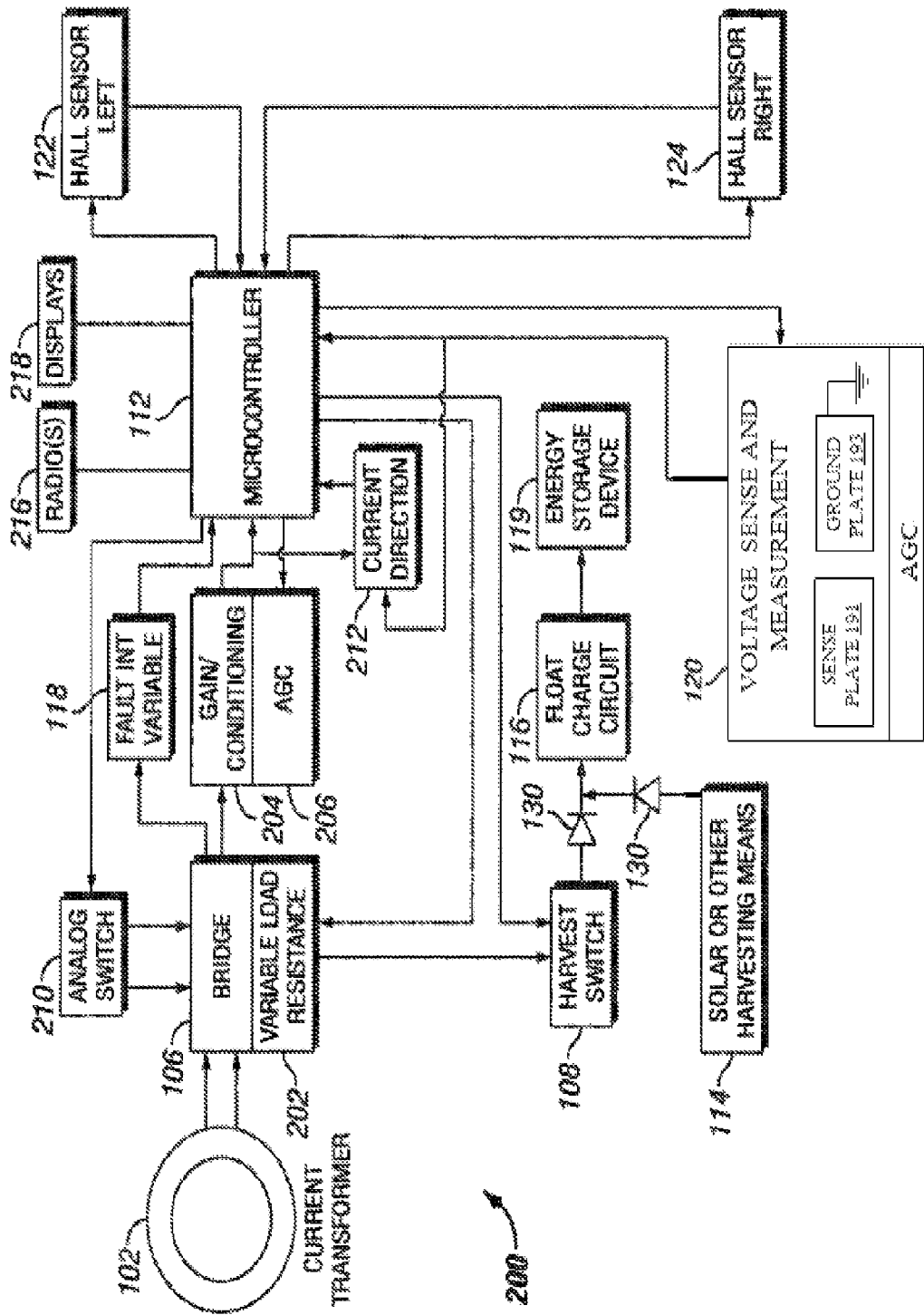
FIG. 2 illustrates another embodiment of a harvesting and measuring current transformer device in accordance with an example embodiment of the present disclosure.

FIG. 2 illustrates another embodiment of a harvesting and measurement device 200 which includes a current transformer 102. The harvesting and measurement device 200 further includes an analog switch 210 which bypasses non-linear elements of the bridge 106 upon command from the microcontroller 112. In certain example embodiments, the analog switch may be any type of switching device capable of coupling and decoupling the bridge 106 from the circuit 104, such as a relay, switch, FET, and the like.

The device 200 further includes a gain/conditioning module 204 which conditions and/or amplifies the current measurement signal received from the current transformer 102. In an example embodiment, the gain/conditioning module 204 remains unpowered in the normal operation mode where accurate current measurements are not needed, and is only powered or used in the demand measurement mode and/or the fault event measurement mode. In certain example embodiments, the bridge 106 is coupled to a variable load resistance 202 which provides the added ability to vary the current transformer load sense resistance. The gain/conditioning module is coupled to an automatic gain control (AGC) 206, which allows for improving the signal resolution based on a nominal value read by the device 200. This allows for improved accuracy over a large range of line currents, such as from 200 milliamps to 600 amps.

The device further includes a current direction 212 detector which utilized data from the voltage measurements and the current measurements to determine the direction of the current and power factor, as discussed above. In certain example embodiments, the device 200 includes a radio 216 and an interface 218. The radio 216 may provide wireless communication means from the device 200 to an operator or other machine, and/or from the operator or other machine to the device 200. The interface 218 may include a display and/or input device which allows the device 200 to output information to be read by the operator and/or receive control commands from the operator. In certain example embodiments, the radio 216 and interface 218 remain unpowered during the normal operation mode.

FIG. 4 illustrates a process flowchart of a method of taking a demand current or voltage measurement 400 in the demand measurement mode. Referring to FIG. 4, when it is desired to make a demand current measurement, whether based on user command or a preprogrammed schedule, the FETs 110 or switches 210 are controlled by the microcontroller 112 to bypass or short out the energy harvesting bridge 106 (step 402). Thus, non-linear elements are temporarily removed from the device circuit 104 such that accurate current measurements can be made. The device 100 then takes the current measurements and takes N ADC readings over one AC cycle (Step 404). The device 100 then calculates a raw root mean square (RMS) value from the N ADC readings (Step 406). Then the device 100 determines whether or not the raw RMS value is optimal (Step 408), which indicates a strong robust signal.

If it is determined that the RMS value is optimal, then no more current reading need to be taken in this round and the device 100 restores the energy harvesting bridge 106 (step 412). The device 100 then uses the measurements from the raw RMS to apply a slope and offset calibration (step 414) to obtain the current and voltage of the conductor 126. The process is then complete.

However, if it is determined that the RMS value is not optimal, the gain 204 is adjusted (step 410) to produce a more robust current signal, and the process goes to step 404, where another set of N ADC readings are taken with the new gain. The process repeats from step 404 to step 410 until it is determined at step 408 that the raw RMS value is optimal, at which point the process goes to steps 412 and 414 as discussed, and the process is completed.

FIG. 5 illustrates a process flowchart of a method of measuring fault current 500 with the Hall effect sensors 122, 124 as well as with the current transformer. The process generally begins when a qualifying current condition and/or a qualifying voltage condition is detected and an interrupt occurs (step 502). Upon detecting such an event, the microcontroller 112 enables (i.e., powers up) the high powered analog components such as the conditioning components 204, 206 (step 504) in preparation for making accurate current measurements. The microcontroller 112 then enables the Hall effect sensors 122, 124 (step 506). When the Hall effect sensors 122, 124 are powered, the sensors 122, 124 begins alternately taking measurements of the peak values from both sensors over N AC cycles (step 508). Specifically, in an example embodiments, the first (i.e., right) sensor takes a measurement (step 510), and then the second (i.e., left) sensor takes a measurement (step 512). In another example embodiment, the sensors may take measurements in a different order.

Then the current transformer 102 takes a current reading, referred to herein as I_Demand, for possible lower magnitude fault currents (step 514). The current direction is measured (step 516). In certain example embodiments, the current direction is measured by comparing the phase of the line voltage and the line current. The device 100 then determines if the N AC cycles are completed (step 518). If it is determined that the cycles are not completed, then the process returns to step 510 and the respective measurements are taken again in steps 510, 512, 514, and 516 until the N AC cycles are complete.

When it is determined that the N AC cycles are completed, the device 100 determines if I_Demand has reached the saturation current, which signifies a high current condition better measured by the Hall effect sensors 122, 124 than by the current transformer 102 (step 520). If it is determined that the I_Demand has reached the saturation current, then the measured peak values of the first and second Hall sensors 122, 124 are averaged (step 522) and reported as the fault current (step 524). If it is determined that the I_Demand is not saturated, then the I_Demand is reported as the fault current (step 530) and the fault current is reported (step 524). After the fault current is reported, the device 100 enters a fault timer (step 526) and then the Hall sensors 122, 124 are disabled.

Figure 6:
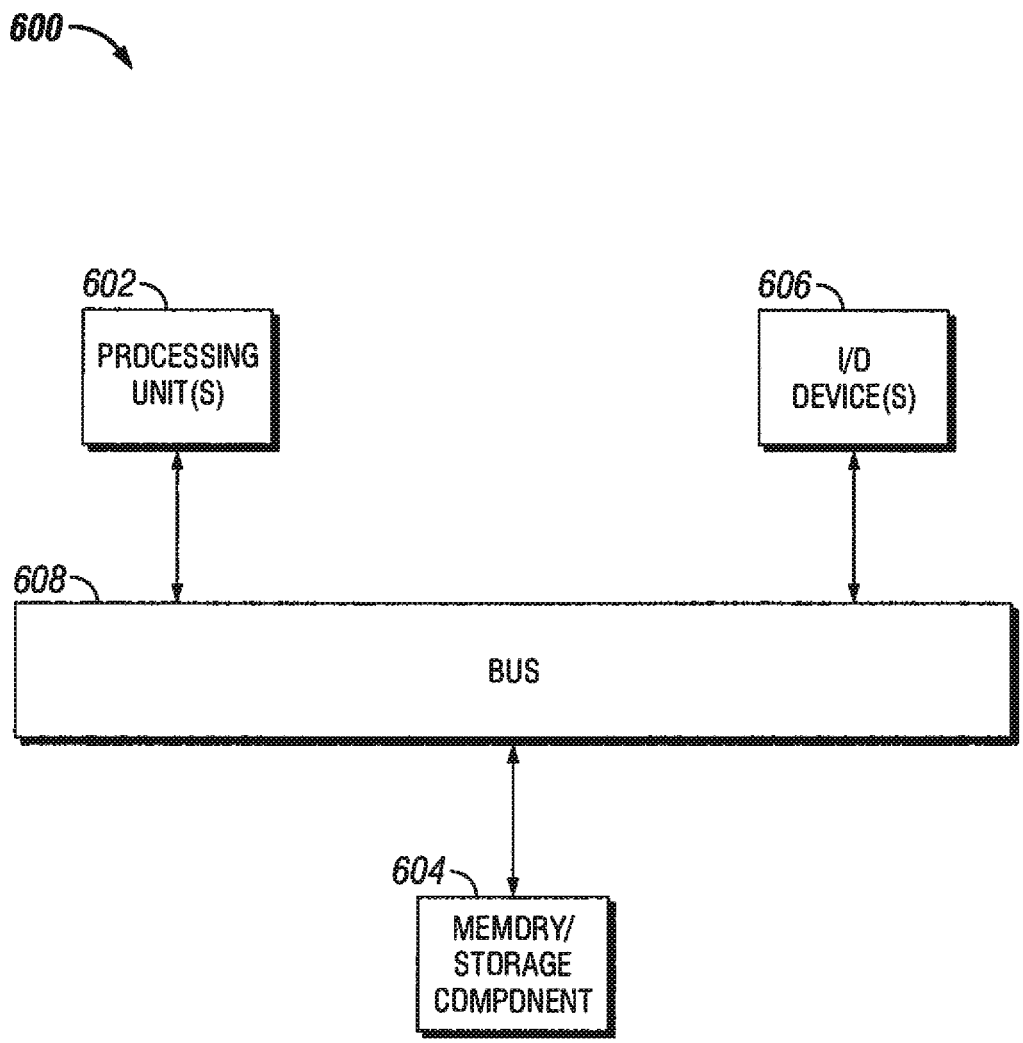
FIG. 6 illustrates a computing device for carrying out the harvesting, and current and voltage measuring functions of a current transformer device in accordance with an example embodiment of the present disclosures.

FIG. 6 illustrates one embodiment of a computing device 600 that can implement one or more of the various techniques described herein, and which may be representative, in whole or in part, of the elements described herein. Computing device 600 is only one example of a computing device and is not intended to suggest any limitation as to scope of use or functionality of the computing device and/or its possible architectures. Neither should computing device 600 be interpreted as having any dependency or requirement relating to any one or combination of components illustrated in the example computing device 600.

Computing device 600 includes one or more processors or processing units 602, one or more memory/storage components 604, one or more input/output (I/O) devices 606, and a bus 608 that allows the various components and devices to communicate with one another. In certain example embodiments, the microcontroller 112 shown in FIG. 1 includes the computing device 600. In certain example embodiments, the microcontroller 112 includes the one or more processors or processing units 602 and/or the memory/storage component 604. Bus 608 represents one or more of any of several types of bus structures, including a memory bus or memory controller, a peripheral bus, an accelerated graphics port, and a processor or local bus using any of a variety of bus architectures. Bus 608 can include wired and/or wireless buses.

Memory/storage component 604 represents one or more computer storage media. Memory/storage component 604 may include volatile media (such as random access memory (RAM)) and/or nonvolatile media (such as read only memory (ROM), flash memory, optical disks, magnetic disks, and so forth). Memory/storage component 604 can include fixed media (e.g., RAM, ROM, a fixed hard drive, etc.) as well as removable media (e.g., a Flash memory drive, a removable hard drive, an optical disk, and so forth).

One or more I/O devices 606, such as the radios 216, allow a customer, utility, or other user to enter commands and information to computing device 600 or microcontroller 112, and also allow information to be presented to the customer, utility, or other user and/or other components or devices. Examples of input devices include, but are not limited to, a keyboard, a cursor control device (e.g., a mouse), a microphone, and a scanner. Examples of output devices include, but are not limited to, a display device (e.g., a monitor or projector), speakers, a printer, and a network card. In certain example embodiments, the I/O devices 606 are physically attached to the computing device 600. In certain other example embodiments, the I/O devices 606 are electrically or communicatively coupled to the computing device 600 such that the I/O devices 606 can be located remotely or wirelessly from the computing device 600.

Various techniques may be described herein in the general context of software or program modules. Generally, software includes routines, programs, objects, components, data structures, and so forth that perform particular tasks or implement particular abstract data types. An implementation of these modules and techniques may be stored on or transmitted across some form of computer readable media. Computer readable media may be any available non-transitory medium or non-transitory media that can be accessed by a computing device. By way of example, and not limitation, computer readable media may comprise "computer storage media".

"Computer storage media" and "computer readable medium" include volatile and non-volatile, removable and non-removable media implemented in any method or technology for storage of information such as computer readable instructions, data structures, program modules, or other data. Computer storage media include, but are not limited to, computer recordable media such as RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The computer device 600 may be connected to a network (not shown) (e.g., a local area network (LAN), a wide area network (WAN) such as the Internet, or any other similar type of network) via a network interface connection (not shown). Those skilled in the art will appreciate that many different types of computer systems exist (e.g., desktop computer, a laptop computer, a personal media device, a mobile device, such as a cell phone or personal digital assistant, or any other computing system capable of executing computer readable instructions), and the aforementioned input and output means may take other forms, now known or later developed. Generally speaking, the computer system 600 includes at least the minimal processing, input, and/or output means necessary to practice one or more embodiments. Further, those skilled in the art will appreciate that one or more elements of the aforementioned computer device 600 may be located at a remote location and connected to the other elements over a network.

Although embodiments of the present disclosure have been described herein in detail, the descriptions are by way of example. The features of the disclosure described herein are representative and, in alternative embodiments, certain features and elements may be added or omitted. Additionally, modifications to aspects of the embodiments described herein may be made by those skilled in the art without departing from the spirit and scope of the present disclosure defined in the following claims, the scope of which are to be accorded the broadest interpretation so as to encompass modifications and equivalent structures.

What is claimed is:

1. A harvesting and measurement device, comprising:
   a current transformer; and
   a device circuit coupled to the current transformer, the device circuit comprising:
      an energy harvesting circuit comprising non-linear elements;
      a switching device coupled to the energy harvesting circuit capable of conductively coupling and decoupling the energy harvesting circuit from the device circuit;
      a microcontroller coupled to the switching device, wherein the microcontroller controls the switching device to couple and decouple the energy harvesting circuit from the device circuit; and
      at least one high current sensor coupled to the microcontroller;
   wherein the device circuit is operable in at least a normal operation mode, a demand measurement mode, and a fault measurement mode;
   wherein in the normal operation mode, the energy harvesting circuit is conductively coupled to the device circuit and the current transformer;
   wherein in the demand measurement mode, the energy harvesting circuit is conductively decoupled from the device circuit, and the current transformer is configured to make current readings; and
   wherein in the fault measurement mode, the high current sensor is energized and configured to make current readings.

2. The harvesting and measurement device of claim 1, wherein in the normal operation mode, the device continuously monitors current and/or voltage levels.

3. The harvesting and measurement device of claim 1, wherein the device circuit is put into the fault measurement mode when a qualifying condition is detected.

4. The harvesting and measurement device of claim 3, wherein the qualifying condition comprises a certain current rise with respect to time, a certain out-of-range voltage activity, or both.

5. The harvesting and measurement device of claim 1, wherein the at least one high current sensor comprises a first Hall sensor and a second Hall sensor, wherein the first Hall sensor is disposed on a side of the current transformer opposite the second Hall sensor, wherein when the current transformer is disposed around a conductor, the first Hall sensor and the second Hall sensor are on opposite sides of the conductor.

6. The harvesting and measurement device of claim 1, wherein the at least one high current sensor remains unpowered until the device circuit is put into the fault measurement mode.

7. The harvesting and measurement device of claim 1, wherein the device circuit further comprises:
   at least one alternate harvesting means, wherein the at least one alternate harvesting means harvests energy from at least one alternative energy source;
   wherein the at least one alternate harvesting means is operable when the device circuit is in the normal operation mode and the demand measurement mode.

8. The harvesting and measurement device of claim 7, wherein the at least one alternate energy source is chosen from a group consisting of solar energy, wind energy, vibrational energy, thermal energy, RF noise, electrostatic energy, or a battery.

9. The harvesting and measurement device of claim 1, wherein the device circuit further comprises:
   a voltage sensing means, wherein the voltage sensing means is configured to monitor voltage on a conductor and indicate an out-of-range voltage level.

10. The harvesting and measurement device of claim 5, wherein the first and second Hall sensors are capable of detecting current on one or more adjacent conductors.

11. A method of making a demand current measurement, comprising:
   bypassing one or more energy harvesting elements in a device circuit, wherein the one or more energy harvesting elements comprises one or more non-linear elements;
   taking a series of current measurement readings with a current transformer, wherein the current transformer is coupled to the device circuit;
   restoring the one or more energy harvesting elements in the device circuit; and
   calculating a current measurement from the series of current measurement readings.

12. The method of making a demand current measurement of claim 11, further comprising:
   calculating a raw root-mean-square (RMS) value from the series of current measurement readings; and
   calculating a current measurement from the raw RMS value.

13. The method of making a demand current measurement of claim 12, further comprising:
   determining if the raw RMS value is optimal;
   restoring the one or more energy harvesting elements in the device circuit if the raw RMS value is optimal;
   adjusting a gain of the device circuit if the raw RMS value is not optimal; and
   taking a second series of current measurement readings after adjusting the gain.

14. A method of making a high current measurement, comprising:

enabling at least one high current sensor in a device circuit;
making a first current measurement with the at least one high current sensor;
making a second current measurement with the current transformer;
making a current direction measurement;
determining if a number of AC cycles is completed,
making another first current measurement, another second current measurement, and another current direction measurement if the number of AC cycles is not completed; and
reporting a fault current measurement if the cycle is completed.

15. The method of making a high current measurement of claim 14, further comprising:
detecting a qualifying fault event; and
enabling the at least one high current sensor when the qualifying high current event is detected.

16. The method of making a high current measurement of claim 14, further comprising:
enabling the at least one high current sensor and a second high current sensor;
making a first high current measurement with the at least one high current sensor; and
making a second high current measurement with the second high current sensor.

17. The method of making a high current measurement of claim 16, further comprising:
averaging the first high current measurement and the second high current measurement; and
reporting the average of the first high current measurement and the second high current measurement as the fault current measurement.

18. The method of making a high current measurement of claim 14, further comprising:
determining if the second current measurement reaches a current transformer saturation value;
reporting the second measurement as the fault current measurement if the second measurement does not reach the current transformer saturation value; and
reporting the first current measurement as the fault current measurement if the second measurement does reach the current transformer saturation value.

19. The method of making a high current measurement of claim 14, further comprising:
making an adjacent conductor current measurement from an adjacent conductor using the at least one high current sensor, wherein the at least one high current sensor comprises a first Hall sensor and a second Hall sensor.

20. A harvesting and measurement device, comprising:
a current transformer; and
a device circuit coupled to the current transformer, wherein the device circuit is operable in at least a normal operation mode and a demand measurement mode, the device circuit comprising:
an energy harvesting circuit comprising non-linear elements, wherein the energy harvesting circuit harvests energy through the current transformer in the normal operation mode;
a current measuring circuit, wherein the current measurement circuit measures current through the current transformer in at least the demand measurement mode; and
a voltage measuring circuit configured to make voltage measurements in at least the demand measurement mode, the voltage measurement circuit comprising:
a pair of plates comprising a ground plate and a sense plate, wherein when a conductor traverses the current transformer, the ground plate is at the line potential of the conductor.

21. The harvesting and measurement device of claim 20, wherein the voltage measurement circuit is configured to monitor voltage on a conductor and produce an indication when the voltage is outside of a voltage window.

22. The harvesting and measurement device of claim 21, wherein the voltage measurement circuit is configured to self-adjust the voltage window according to sensed voltage and/or configurable window settings.

* * * * *